(12) United States Patent
Livshits

(10) Patent No.: US 6,215,099 B1
(45) Date of Patent: Apr. 10, 2001

(54) MULTI-LASER COMBUSTION SURFACE TREATMENT

(75) Inventor: Boris Lev Livshits, Carmiel (IL)

(73) Assignee: Oramir Semiconductor Equipment Ltd., Yokneam Llit (IL)

( * ) Notice: Subject to any disclaimer, the term of this patent is extended or adjusted under 35 U.S.C. 154(b) by 0 days.

(21) Appl. No.: 09/256,056

(22) Filed: Feb. 23, 1999

(30) Foreign Application Priority Data

Feb. 23, 1998 (IL) .......................................................... 123416

(51) Int. Cl.$^7$ .................................................. B23K 26/00
(52) U.S. Cl. .................................. 219/121.76; 219/121.6; 219/121.65; 219/121.66; 219/121.68; 219/121.69
(58) Field of Search ........................... 219/121.76, 121.6, 219/121.65, 121.66, 121.68, 121.69, 121.73, 121.85; 372/69, 92

(56) References Cited

U.S. PATENT DOCUMENTS

| | | | |
|---|---|---|---|
| 4,606,747 | * | 8/1986 | Steinhoff .................................. 65/31 |
| 4,635,264 | * | 1/1987 | Gobel et al. .............................. 372/18 |
| 4,660,205 | * | 4/1987 | Harter et al. ............................. 372/18 |
| 5,114,834 | | 5/1992 | Nachshon . |
| 5,691,989 | * | 11/1997 | Rakuljic et al. ......................... 372/20 |
| 6,021,154 | * | 2/2000 | Unternahrer ........................... 372/108 |

FOREIGN PATENT DOCUMENTS

| | | |
|---|---|---|
| 9717163 | 5/1997 | (WO) . |
| 9717164 | 5/1997 | (WO) . |
| 9717166 | 5/1997 | (WO) . |
| 9717167 | 5/1997 | (WO) . |
| 9810886 | 3/1998 | (WO) . |
| 9822254 | 5/1998 | (WO) . |

\* cited by examiner

Primary Examiner—Patrick Ryan
Assistant Examiner—M. Alexandra Elve
(74) Attorney, Agent, or Firm—Baker Botts L.L.P.

(57) ABSTRACT

A method of Multi-Laser Combustion (MLC) surface treatment, by irradiation with laser beams, which includes generating several laser beams having synchronized pulses and controlled delays, unifying the beams to a single beam and optically splitting every laser pulse into a number of sub-pulses.

18 Claims, 5 Drawing Sheets

MULTI-LASER COMBUSTION SURFACE TREATMENT

FIELD OF THE INVENTION

The present invention relates to laser surface treatments, particularly to method and apparatus for the generation of laser beams, which permit high throughout and damage-free UV laser removal of foreign materials, as photoresists, particles and the like, from the surfaces of substrates, such as, e.g., semiconductor wafers in various production stages, and to surface treatments wherein said laser beams are generated by the aforesaid method and apparatus.

BACKGROUND OF THE INVENTION

In the manufacturing of various products, it is necessary to apply a layer of protective material on a surface, which must be removed after a specified manufacturing step has been concluded. An example of such a process is the so-called "masking", where a pattern is created on a surface using a layer of protective material illuminated through a mask, and the surface is then treated with a developer which removes material from the unmasked portions of the surface, therefore leaving a predetermined pattern. The surface is then treated by ion implantation or by etching agents, which introduce the imprinted species into the unmasked portions of the surface, or remove material from unmasked portions. Once these processes are completed, the role of the protecting mask ends and it must be removed. The process is conventional and well known in the art, and is described, e.g., in U.S. Pat. No. 5,114,834.

Two main photoresist stripping methods exist in the modern VLSI/ULSI (Very/Ultra Large Scale Integration) circuits industry:

1) Wet stripping, which uses acids or organic solvents;
2) Dry stripping, which uses plasma, $O_3$, $O_3/N_2O$ or $UV/O_3$-based stripping.

Both methods are problematic and far from being complete, especially when taking into consideration the future miniaturization in the VLSI/ULSI industry. The current technology is capable of dealing with devices having feature sizes of about 0.5 m, but before the end of the century, the expectation is that the workable size of the devices is to be reduced to 0.25 m. The anticipated size change requires considerable changes in the manufacturing technology, particularly in the stripping stage. The prior art photoresist stripping techniques described above will be unsuitable for future devices, as will be explained hereinafter.

Utilizing only the wet stripping method is not a perfect solution, as it cannot completely strip photoresist after tough processes that change the chemical and physical properties of the photoresist in such a way that makes its removal very difficult. Such processes include, e.g., High Dose Implantation (HDI), reactive Ion Etching (RIE), deep UV curing and high temperatures post-bake. After HDI or RIE, the side walls of the implanted patterns or of the etched walls are the most difficult to remove.

In addition, the wet method has some other problems: the strength of the stripping solution changes with time, the accumulated contamination in the solution can be a source of particles which adversely affect the performance of the wafer, the corrosive and toxic content of stripping chemicals imposes high handling and disposal costs, and liquid phase surface tension and mass transport tend to make photoresist removal uneven and difficult.

The dry method also suffers from some major drawbacks, especially from metallic and particulate contamination, damage due to plasma-charges, currents, electric fields and plasma-induced UV radiation, as well as temperature-induced damage, and, especially, incomplete removal. During various fabrication stages, as discussed above, the photoresist suffers from chemical and physical changes which harden it, and this makes the stripping processes of the prior art extremely difficult to carry out. Usually, a plurality of sequential steps, involving wet and dry processes, are needed to completely remove the photoresist.

The art has addressed this problem in many ways, and commercial photoresist dry removal apparatus is available, which uses different technologies. For instance, UV ashers are sold, e.g. by Hitachi, Japan (UA-3150A), dry chemical ashers are also available, e.g., by Fusion Semiconductor Systems, U.S.A., which utilize nitrous oxide and ozone to remove the photoresist by chemical ashing, microwave plasma ashing is also effected, e.g., as in the UNA-200 Asher (ULVAC Japan Ltd.). Also, plasma photoresist removal is employed and is commercially available, e.g., as in the Aspen apparatus (Mattson Technology, U.S.A.), and in the AURA 200 (GASONICS IPC, U.S.A.).

More recently, photoresist removal has been achieved by ablation, using laser UV radiation, in an oxidizing environment, as described in U.S. Pat. No. 5,114,834. The ablation process is caused by strong absorption of the laser pulse energy by the photoresist. The process is a localized ejection of the photoresist layer to the ambient gas, associated with a blast wave due to chemical bonds breaking in the photoresist and instant heating. The partly gasified and partly fragmented photoresist is blown upwards away from the surface, and instantly heats the ambient gas. Fast combustion flash of the ablation products occurs, after each laser pulse, due to the photochemical reaction of the UV laser radiation and the process gases, which may also be due to the blast wave. The main essence of the process is laser ablation with combustion flash of the ablated photoresist, which occurs in a reactive gas flowing through an irradiation zone. The combination of laser radiation and fast combustion provides instantaneous lowering of the ablation threshold of hard parts of the photoresist (side walls). The combusted ablation products are then removed by vacuum suction, or by gas sweeping, leaving a completely clean surface.

While U.S. Pat. No. 5,114,834 provides an important novel process, it still does not provide a high throughput, which is industrially convenient, viz. an industrially acceptable number of wafers that can be stripped during a given time. The laser stripping throughput is determined by the stripping rate or by the number of laser pulses needed for providing complete stripping of a unit area of the photoresist per unit of time.

While reference will be made throughout this specification to the ablation of photoresist from semiconductor wafers, this will be done for the sake of simplicity, and because it represents a well known and widely approached problem. It should be understood, however, that the invention described hereinafter is by no means limited to the stripping of photoresist from wafers, but it applies, *mutatis mutandis*, to many other applications, such as stripping and cleaning of photoresist from Flat Panel Displays (FPD) or removal of residues from different objects, such as lenses, semiconductor wafers, or photo-masks.

The aforementioned U.S. Pat. No. 5,114,834 defines the process window of laser stripping, and indicates that there are certain energy fluence levels of the laser pulse which may damage the wafer being treated. So far, however, the art has failed to provide a method which conveniently permits to utilize the energy of an excimer laser in a way that allows to increase the fluence damage threshold defined in U.S. Pat. No. 5,114,834, without incurring the risk of damaging the surface of the object being treated. The types of damage due to laser energy include thermal damages, such as ripples due in particular to difference in expansion coefficients, e.g., $SiO_2$/Si (implanted) and TiN/Al interfaces and related to the fatigue phenomena, aluminum or silicon melting, as well as radiation (ionization) damages, e.g., slight color changes due to small changes in the crystalline structure at $SiO_2$/Si interface (implanted).

WO 97/17164 (PCT/IL/00139), the entire content of which is incorporated herein by reference, discloses a method of damage-free laser surface treatment by extending a laser pulse in time and supplying the same pulse energy to a treated surface during a longer period of time. The pulse extension is carried out by optical means, viz. by means of a Passive Optical Pulse Extender, hereinafter "POPE".

Continuous increasing dimensions of wafers for Next Generation UNVLSI circuits (from 6" to 12", last decade) and the numerous difficulties linked with miniaturization of features of wafers (new photoresists, metals, oxides, higher demands to cleaning, etc.,) complicate severe stripping and cleaning processes, affecting both their yield and throughput.

For high yield throughput laser removal of foreign material from semiconductor wafers, the following conditions must be fulfilled:

1) The UV-Laser (EXCIMER or SOLID STATE) should have a high average power $P_{av} \geq 100W$;
2) Its pulse frequency f should be low (f~50 Hz);
3) Its pulse energy E should be sufficiently high ($E \geq 1$ J); and
4) Its pulse should have a controlled extended duration (up to 200 ns and more).

Any high average power industrial UV-Laser has a high pulse frequency $f \geq 200-250$ Hz, low pulse energy $E \leq 0.5$ J and constant pulse length. A Passive Optical Pulse Extender (POPE) does increase the duration of laser pulse while not being able to change (regulate) it, since optical delays are fixed for any given case. Therefore, a combination of any commercial high average power UV-Laser+POPE does not possess the second, third and fourth of the above-mentioned features needed for providing high (optimal) throughput.

It follows from the aforementioned WO 97/17164 that, for processing in the range of optimal fluence value $F_{opt}$, one needs to provide an appropriate fluence process window. This means that it is necessary to provide a definite pulse extension, thereby decreasing the thermal load on a substrate to prevent its damage.

A variable pulse extension permits to find the approximate optimal fluence values for different types of photoresist:

$F^{ph1}_{opt}, F^{ph2}_{opt}, \ldots, F^{phi}_{opt} \ldots$ where $F^{phi}_{opt}$ is the fluence for the i-th type of photoresist. Each value of $F^{phi}_{opt}$ requires its pulse extension. The implementation of a number of pulse extensions needs the continuous changing of time intervals between subpulses produced in optical pulse extenders for pulse extension (see the cited WO 97/17164). Thus, changing pulse extension would provide both a damage-free and an optimal Multi-Laser Combustion (MLC) surface treatment. However, the optical pulse extender has constant optical delays, and therefore cannot provide a controlled pulse extension, as well as an optimal MLC surface treatment.

As noted in the aforesaid WO 97/17164, the fluences required for laser removal of foreign materials can be so high that the laser pulse duration must be extended many times to avoid damage of the treated surface. However, the combination of high power laser with optical pulse extension is not sufficient in many cases, because it cannot provide a sufficiently low pulse frequency and controlled pulse extension, and, whenever a large pulse extension is required, very high losses of pulse energy occur in the passage of the pulse through the elements of the optical extender. Control of the pulse extension is required, because it is necessary to provide in each case an appropriate fluence process window to avoid thermal damage of the treated substrate. Different types of photoresists have different optimal fluence values and each of these requires a different pulse extension. Therefore, controlled pulse extension provides a MLC surface treatment that has an optimal throughput and avoids substrate damage.

A stabilized operation of industrial High Power Lasers (HPL), in particular, HP UV-Excimer Lasers, requires that the pulse energy be relatively low and the pulse frequency high, since the very intensive pumping, which is required to obtain high pulse energy, inevitably causes some instabilities in laser active medium. By "laser active medium" is meant a gas or a solid which, after excitement by discharge or by flash lamp, is capable of generating a laser beam, if a resonator is provided. On the other hand, both low pulse energy and high pulse frequency lead to a lowering of throughput, due to their unfavorable influence on the efficiency of the optical line.

Low pulse energy can provide high optimal values of working fluence only on small areas of laser beam impact. It decreases the efficiency of fluence homogenization on a wafer. In turn, high pulse frequency is not acceptable for dry laser chemical stripping, as hereinbefore explained, and requires a fitting dividing by optical means. As has been said, reduction of the pulse frequency by optical means also causes a significant laser energy loss. Therefore, both these factors sharply deteriorate the efficiency of the optical line.

The above-mentioned causes of decrease of the laser stripping throughput prevent the use of any industrial High Power Excimer Laser for an efficient laser photoresist stripping technology.

It is a purpose of this invention to provide a method and an apparatus for the generation of laser beams, that produce an improvement in surface treatments, particularly in the removal of foreign materials from substrate surfaces, when carried out by irradiation with said laser beams.

It is another purpose of this invention to render possible and efficient the application of High Power Laser Multi-Head systems for photoresist stripping operations.

It is further purpose of this invention to provide a a method and an apparatus for the generation of laser beams that permit to effect MLC surface treatments with high throughput and without damages to the treated surface at a high degree of cleanliness (high yield).

It is a still further purpose of this invention to provide an apparatus for MLC surface treatment with high throughput and without damages to the treated surface at a high degree of cleanliness.

Other purposes and advantages of this invention will appear as the description proceeds.

SUMMARY OF THE INVENTION

The method for the production of laser beams for surface treatments, according to the invention, comprises generating and emitting a plurality of laser beams having electronically synchronized pulses with electronically controlled delays, unifying said beams to a single beam and optically splitting every laser pulse into a number of sub-pulses with constant optical delays.

The said electronic synchronization is achieved by synchronizing the triggering of the pumping means with electronically controlled delays. The control of said triggering is well known to skilled persons, and can be easily accomplished by them.

The laser beams may be optically split before or after they have been unified. The method may comprise modifying near or far fields of the beam, when it is generated, e.g., by expanding it and/or homogenizing it.

The invention further provides an apparatus for carrying out the aforesaid method, which comprises a plurality of laser heads for generating and emitting laser beams, having means for synchronizing the pulses, and a Passive Optical Pulse Extender (POPE) for splitting each laser pulse into a plurality of sub-pulses and producing a controlled delay between successive pluralities of sub-pulses which correspond to different laser pulses.

For the sake of clarity, the term "pulses", when used alone, will refer to the original pulses as emitted by the laser heads. The pulses after splitting will be called "sub-pulses", meaning "pulses that are obtained by splitting the pulses emitted by the laser emitters".

The said plurality of laser heads for generating and emitting laser beams, having means for synchronizing the pulses, may constitute a single Multi-Head Laser with a number (hereinafter, "n") of electronically synchronized pumpings of its heads, or may be a plurality of "n" One-Head Lasers, electronically synchronized. Since in all cases said laser heads produce together an electronic pulse extension without essential losses, they will be designated together by the term "Active Electronic Pulse Extender" (hereinafter abbreviated as "AEPE").

The introduction of Active Electronic Pulse Extension (AEPE) in the combination with POPE allows to realize simultaneously all the conditions providing the high throughput of photoresist stripping. Besides offering more potentiality for pulse extension, it must be emphasized that the combination adds three new features to a high average power UV-Multi Laser system: low pulse frequency, high pulse energy and controlled pulse duration.

For high throughput laser removal of foreign material from semiconductor wafers, the following conditions concerning the laser must be fulfilled:

1) The laser source must have a high average power;
3) The working fluence must have optimal values at the appropriate optimal pulse extension, viz. maximum throughput when all other parameters are the same;
4) The pulse frequency (pulse repetition rate) must be fairly low for the balanced performance of laser radiation impact and gas flow in a process chamber. In other words, it is necessary to permit a fresh portion of process gas to flow on the beam footprint (by "footprint" is meant the area on which the beam impinges on the surface being treated) after every pulse, and this limits the pulse frequency to relatively low values, e.g., in the order of 50–100 Hz.

The method and apparatus of the invention produce a laser beam which has the aforesaid properties. The energy of the laser beam should be made to impact onto the wafer through an optical line having a high efficiency; whereby to effect removal of foreign materials from the wafer with high throughput and without any damage to it.

DETAILED DESCRIPTION OF PREFERRED EMBODIMENTS

As noted hereinbefore, the high pulse frequency, the insignificant flexibility of pulse duration and shape, and the not very high pulse energy of industrial HPLs, which may be in particular High Power UV Excimer Lasers, do not permit the further progression to a high throughput in photoresist stripping technology.

According to the invention, a plurality of laser emitters with the same pulse frequency are combined to make a multi-laser system (AEPE), which, in combination with a POPE, constitutes an apparatus having a high average power and a pulse energy that are the sum of those of the individual emitters, and having the pulse frequency "f" of the said laser emitters and a controlled pulse duration, as hereinafter defined, and shape.

By choosing the number of laser heads of the multi-laser system, the desired average power can be obtained.

Figure 1:
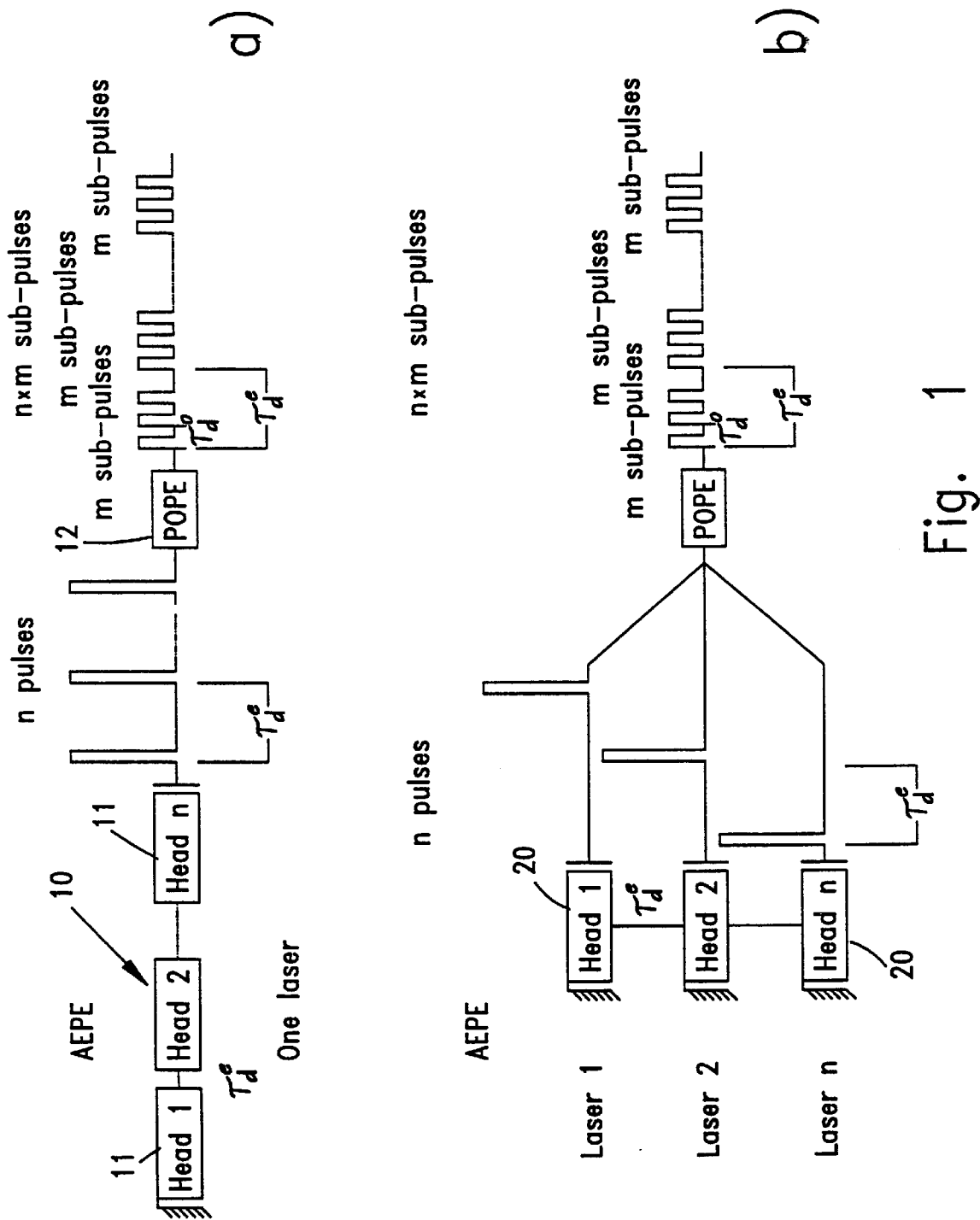
FIG. 1a schematically illustrates the apparatus of the invention in an embodiment in which a plurality of One-Head Lasers are employed.
FIG. 1b schematically illustrates the apparatus of the invention in an embodiment in which a Multi-Head Laser is employed.

FIG. 1a schematically illustrates such an apparatus according to one embodiment thereof. A multi-laser emitter, generally indicated at 10, comprises n heads, each indicated at 11, the number n remaining undetermined. The time interval between successive pulses produced by this system is the controlled electronic delay indicated by $\tau^e d$. The various beams are unified and directed onto the POPE, schematically indicated at 12, and issue from said POPE as sub-pulses in the number of "m" for each original pulse. Between each group of "m" sub-pulses and the successive one, there is a controlled electronic delay. The time interval between successive sub-pulses of each group of m sub-pulses is the constant optical delay indicated by $\tau^o d$, and, since there is said electronic delay, $\tau^e d > m\tau^o d$. However, this is true in the embodiment illustrated, but $\tau^e d$ is a controlled electronic delay, and could be equal to or less than $m\tau^o d$. Parameter "m" will be determined by skilled persons in such a way as to obtain the best results.

FIG. 1b illustrates an embodiment which differs from that of FIG. 1a only in that the n laser heads are separate, each of them being embodied in a Single-Head Laser 20, and the beams separately emitted by separate resonators (instead of a single one for all, as in FIG. 1*a*) and directed into a common channel to the POPE, which operates as in the previous embodiment.

Figure 2:
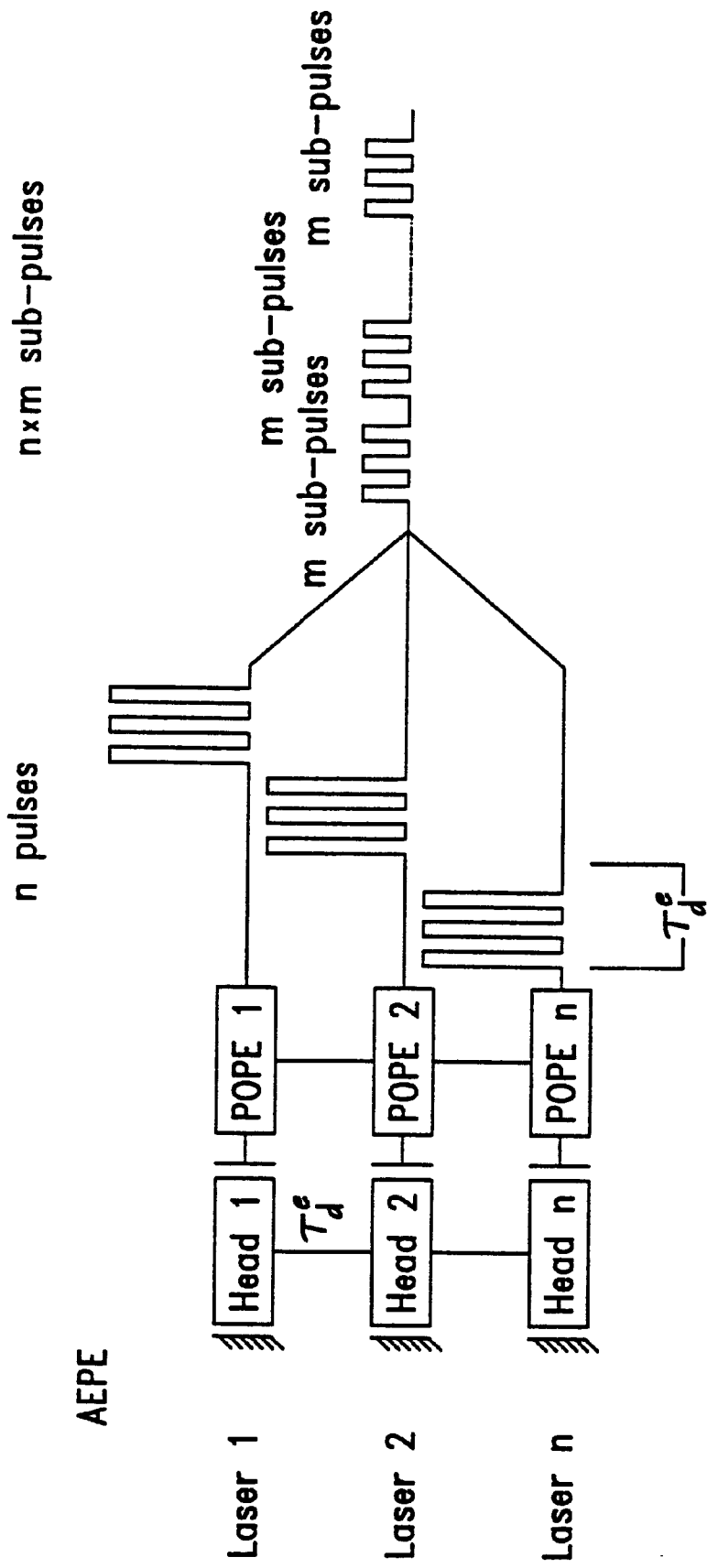
FIG. 2 schematically illustrates a modification of the apparatus of FIG. 1b.

FIG. 2, unlike FIG. 1*b*, represents every laser with its optical pulse extender, that is, laser beam unification occurs here after passing through the POPE.

Figure 3:
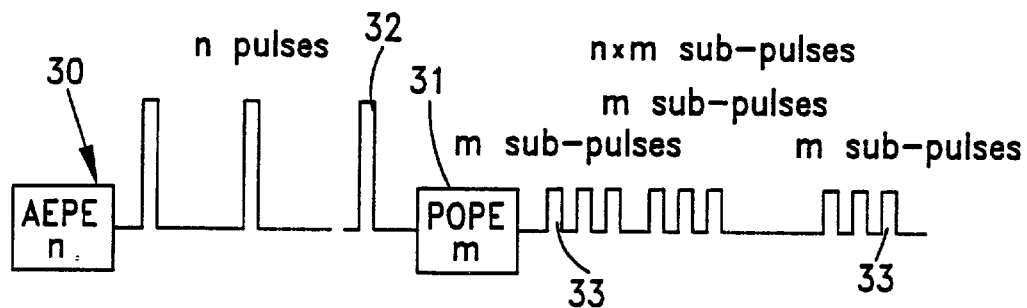
FIG. 3 is a general schematic illustration of the apparatus according to the invention.

FIG. 3 is a schematic representation which generally illustrates the concept of the invention. The plurality of n laser heads, no matter how they are structurally realized, are generally indicated at 30 (n being 3, by way of example only, in the drawing), the unified beams are directed onto the POPE 31, which splits each pulse 32 into m sub-pulses 33 (m being 3, by way of example only, in the drawing), so that the emission of one pulse by each laser head, viz. the emission of n pulses, results in the production of n×m sub-pulses.

Figure 4:
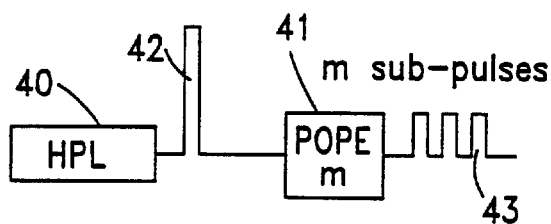
FIG. 4 schematically illustrates, for comparative purposes, an apparatus not according to the invention.

FIG. 4 is provided for comparative purposes. It is assumed that a single HPL 40 is provided, and in that case, even if a POPE 41 is used, only m sub-pulses 43 result from each pulse 42 of the laser head. The scheme of FIG. 4 (prior art) can be compared to the general concept of the invention (FIG. 3). The use of a plurality of heads allows the use of lasers with a very short pulse duration (few ns) for laser stripping, and to change the fluence process window with a wide range to perform stripping in each case at the optimal fluence values. The duration of pulse for the excimer laser is 20–40 ns, but the duration of the solid state harmonic pulse is 3–5 ns, and is considered very short. The duration of each separate sub-pulse is equal to the duration of each laser pulse. By dividing one pulse into a number of sub-pulses and establishing some optimal distance between them, larger fluence process windows are obtained.

Figure 5:
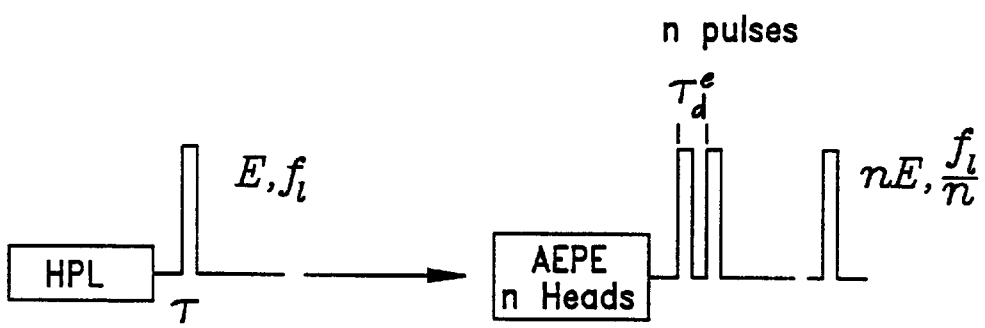
FIG. 5 schematically illustrates the transition from an HPL to an AEPE.

The high average power of an HPL can be expressed by $P = E f_1$, and it is the product of a relatively (though not very) high laser pulse energy E and a high pulse frequency $f_1$. The same average power could be obtained by means of n synchronized heads, each having the same pulse energy E and frequency $f_1/n$ (see FIG. 5). The transition from the HPLs to the Multi-Head Laser System of Active Electronic Pulse Extension (AEPE) according to the invention has the following consequences:

1—The generation of pulses is multiplied by n*m;
2—The common pulse energy E' is multiplied by n, viz. E'=nE;
3—The frequency $f_1$ is divided by n; and
4—The average power is maintained, viz. $P' = nE * f_1/n = E \times f_1$.

In contrast to the passive optical extension (POPE), in the AEPE system, every pulse is generated by a separate laser head, which is therefore "active". Therefore, a Multi-Head Laser System simultaneously generates and extends laser pulses, controlling them and transforming them into groups of sub-pulses, forming an interval of time which may be, for example, $\tau \leq 0.5 * 10^{-6}$ s (compared with a period of laser pulses $1/f_1$, which is from about $10^{-3}$ to $10^{-1}$ s).

Since the industrial UV-Excimer lasers ($\lambda$=193, 248 nm) have a pulse length in the range of 25–40 ns, which is not very short, when the length of the extended pulses should not exceed 150–200 ns, it is enough to use a number of laser heads, that is, an AEPE, to obtain the required pulse extension without a POPE. This is advantageous because the POPE introduces additional losses in the optical line. However, harmonics of solid state laser radiation with the wave length $\lambda$~200–250 nm have too short a pulse duration ($\tau$~5 ns), and therefore their pulses require both electronic and optical extension, as the number of laser heads cannot be very large.

It is clear that the multi-beam system of the invention offers the option of using simultaneously two or more wavelengths of laser radiation for the removal of foreign material, in particular, different types of photoresist, from semiconductor wafers. Such a system is potentially much more flexible, since its influence on the stripping process efficiency is mainly due to its higher photochemical capability. A preferred combination of lasers for carrying out the invention is the combination of two lasers emitting beams of wavelengths 193 and 248 nm, but this is merely a preferred case and other wavelengths may be used.

The modem laser industry is able to produce UV-Excimer lasers of main average power $P_{av}$~40–50 W, with a stabilized pulse energy E~600 mJ and a laser pulse frequency $f_1$ 50–100 Hz. Such lasers can be the main components of an industrial Multi-Head Laser System of high average power $P_{av}$>100–200 W (for a number of laser heads n≧2) at a low pulse frequency and high pulse energy, with controlled pulse duration and shape, as well.

The AEPE according to the invention has many advantages, and in particular, it allows:

a) to lower the pulse frequency simply by choosing industrial lasers with a low pulse frequency and with the same pulse energy, or a slightly higher pulse energy than the high power lasers;
b) to increase the overall, multiplicated pulse energy of the lasers by combining them;
c) to provide, by its combination with POPE, a multiplicative pulse breeding m×n, which prevents damages even when "m" is small, and therefore, energy losses in the POPE are small; and
d) to control the multiplicated pulse duration by changing the electronic delays.

The term "multiplicated", as applied herein to pulse, pulse energy, pulse extension, or pulse fluence, means that the pulse, pulse energy, pulse extension, or pulse fluence, as the case may be, is that of the beams as they issue from the AEPE.

In this way, a high power laser system is obtained, which has: 1—the low multiplicated pulse frequency needed for a balance between delivering the pulse energy and the process gas to a beam footprint on the treated substrate; 2—a high multiplicated pulse energy which permits to work with a larger laser beam footprint area, which increases the efficiency of the optomechanical scanning of the treated surfaces; 3—a high multiplicated pulse extension without essential losses of energy within the POPE; and 4—a control duration of the multiplicated pulse, which permits to find the optimal value both for its duration and for a multiplicated pulse fluence, specifically for the MLC treatment of semiconductor wafers. The progress connected with this invention is therefore apparent.

Other operations, besides the generation of the laser beam, that may be carried out in surface treatments, and particularly in the removal of foreign materials from the surfaces of semiconductor wafers and the like(such as realization, homogenizing, beam footprint shaping, beam footprint diversion, article irradiation through window and gas flow of the process chamber)may be implemented by skilled persons, particularly as taught in PCT patent applications WO 97/17163, WO 97/17164, WO 97/17166, WO 97/17167, WO 98/10886 and WO 98/22254

Figure 6:
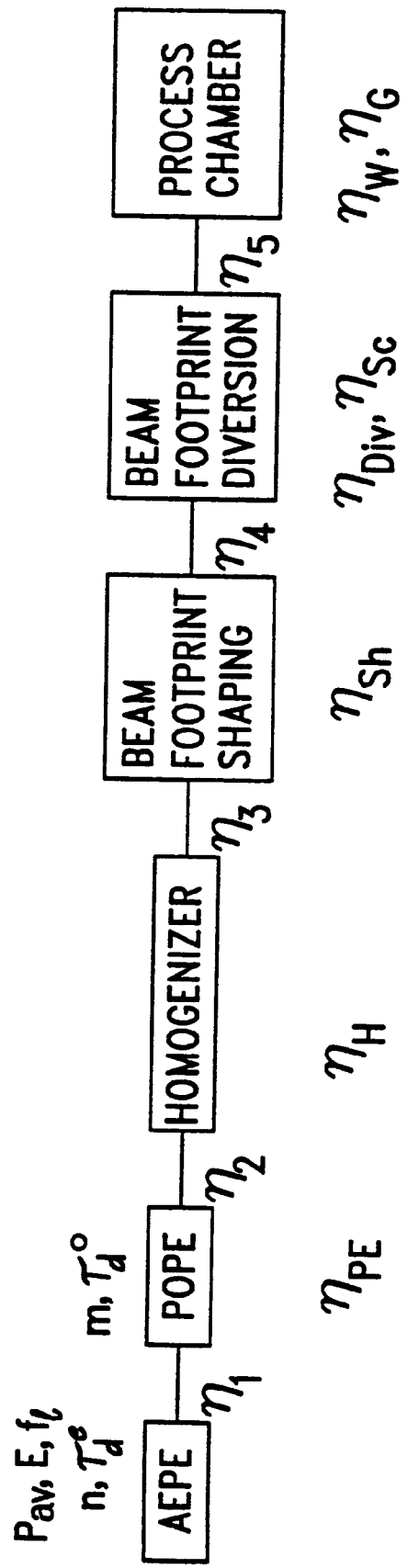
FIG. 6 is a block diagram of an apparatus according to an embodiment of the invention, in which $\eta_1, \eta_2, \eta_3, \eta_4, \eta_5$ are the efficiencies of corresponding relay lines; $\eta_{PE}$ is the efficiency of POPE, $\eta_H$ is the efficiency of laser radiation homogenizing; $\eta_{SH}$ is the efficiency of laser beam footprint shaping; $\eta_{div}$ is the efficiency of laser beam footprint diversion; $\eta_W$ is the efficiency of the process chamber window; $\eta_G$ is the efficiency of process gas; and $\eta_{SC}$ is the efficiency of laser beam footprint scanning.

TA block diagram of an embodiment of laser treatment of surfaces is shown in FIG. 6, on which are marked the main parameters of the separate blocks defining a throughput of the laser surface treatment process. With reference to FIG. 6, and to the corresponding apparatus diagram of FIG. 7, one can derive the relationship expressing the throughput as a function of $P_{av}$, $\eta$, F and N at the blanket covering a treated surface by laser irradiation, where:

$P_{av}$ is the average power of AEPE;

$\eta$ is the efficiency $\eta_{op}$ of the optical line, including window and absorbing gas flow in the process chamber, multiplied by efficiency $\eta_{sc}$ of the beam footprint scanning of the treated surface, viz. $\eta = \eta_{op} * \eta_{sc}$ (see FIGS. 6 and 7);

F is the laser pulse fluence on the treated surface, and

N is the minimum number of pulses needed for cleaning so that $\Phi$=FN is the cleaning fluence of the process;

$F_0$ is the pulse fluence in the normal intersection of the laser beam.

Indeed, $\eta P_{av}$ is the laser energy incident upon a wafer per second, and the product FN is the energy required for a complete cleaning of one cm$^2$ of surface, for example, for a complete removal of one cm$^2$ of photoresist from a surface. Consequently, the ratio of these values $$\Pi[cm^2/sec] = \eta P_{av}/FN \quad (1)$$

means the rate of surface treatment, e.g., the area in [cm$^2$] of photoresist on a wafer surface removed for one second. If the area of wafer equals $S_w$ [in cm$^2$], then the rate of surface treatment [in w/hr], that is the throughput, is given by $$\Pi[w/hr] = (\eta P_{av}/FN) \times (3600/S_w) \quad (2)$$

Here, one can see that the throughput decreasing should be expected due to the geometrical factor ($S_w$), which we have noted in the Background of the Invention.

The function $$\Phi = FN(F,\tau; \alpha, \phi(t); S_{fp}, h, V, v, f, \lambda, p_1, p_2, p_3, \ldots, p_n, P=\Sigma p_i, T) \quad (2)$$

is the cleaning fluence function which determines a dependence of Throughput $\Pi$ from 1) the laser pulse parameters F, $\tau$, 2) the laser beam dynamic orientation parameters $\alpha$, $\phi(t)$, 3) the combustion process confinement parameters $S_{fp}$, h, V, v, f and 4) the combustion process photo-thermo-chemistry parameters $\lambda$, $p_1$, $p_2$, $p_3$, ... $p_n$, P=$\Sigma p_i$, T, where $\tau$ is the laser pulse duration in [nsec];

f is the laser pulse incidence frequency;

$\alpha$ is the beam incidence angle;

$\phi$ is the beam incidence azimuth, which can change from pulse to pulse or from one stage of scanning to another;

t is the time;

$S_{fp}$ is the footprint area in [cm$^2$];

h is the gap between wafer and optical window of the process chamber in [cm];

V is the Process gas flow velocity in [cm/sec];

v is the footprint scanning velocity;

$\lambda$ is the wavelength of laser radiation in [nm];

$p_i$ is the partial pressure of the process gas i-th component in [bar];

P is the process gas pressure; and

T is the temperature of the treated article (wafer).

Thus, according to Eq. (1) and (2), there are seven factors of the throughput rise, namely:

1) Laser pulse
2) Laser beam orientation
3) Combustion process confinement
4) Combustion process photo-thermo-chemistry, as well as
5) Optical line efficiency
6) Scanning efficiency, and
7) Average power of ML System.

Throughput rise is related, on the one side, to the efficiency of all processes, providing an article surface treatment, in particular, a foreign material removal from a surface ((1)–(4) positions), and on the other side, to an average power of pulsed laser radiation and efficiency of its delivering to a treated area of article surface ((5)–(7) positions).

A proper choice of parameters (throughput organization), concerning the four first factors, leads to minimization of cleaning fluence function $\Phi$, that is, to a minimum of energy FN needed for the cleaning of one cm$^2$ of treated surface (see Eq. (1)). This proper choice can be effected, in practice, by dividing all the parameters of function $\Phi$ on parts which correspond to the four regions 1)–4), and successive optimization inside any of these groups of parameters. Because of strong synergetic influence of the second and fourth groups of processes (anisotropy of laser chemical assisted etching and laser induced isotropy chemical etching, accordingly), it would be expedient to unite them during this procedure of successive throughput optimization. After that, as shown by some experimental data, the cleaning fluence in Eq. (1) could be approximately factorized.

$$\Phi \cong \Phi_1(F, \tau) \cdot \Phi_2(\alpha, \phi(t), \lambda, p_1, p_2, p_3, \ldots p_n, P, T) \cdot \Phi_3(S_{fp}, h, V, v, f). \quad (3)$$

So, initially one should optimize all the processes linked with a combustion confinement determined by the third group of parameters $S_{fp}$, h, V, v, f. In particular, one needs to establish balance between the pulse incidence frequency f and a process gas flow velocity V, first of all taking into consideration infringement of combustion confinement and conditions of effective drag of non-volatile material by flow.

As well as it should be balanced between f, the linear dimension of a beam footprint $\sqrt{S_{fp}}$ and the scanning velocity v. This last balance allows to prevent formation of deposits out of the beam footprint due to transfer of material by flow from a beam footprint to the outlet of the process chamber. This condition elevates substantially the throughput of photoresist stripping.

The further procedure goes through the joint optimizing function $\Phi_2$ of an anisotropy of laser etching ($\alpha, \phi(t)$), as well as an isotropy chemical etching and the synergetically linking combustion ($\lambda$, $p_1$, $p_2$, $p_3$, ... $p_n$, P, T). At that, if it is necessary to preserve selectivity of this synergetic process, one should bear in mind that amplification of isotropy chemical etching is used to promote a selectivity deterioration, while an anisotropy of laser etching, that is, a proper orientation of laser beam, on the contrary, can elevate selectivity of etching, being the main driver of a throughput increase. It means that, in the case of photoresist stripping when a substrate (dielectric, metal, silicon) should not be subjected to etching, a chemical etching must be confined.

And the conclusive step of defining the optimal values of MLC-Stripper parameters, for any given layer of photoresist, will be reduced to experimental optimization of cleaning fluence as the function $\Phi_1(F,\tau)$ of the variables F and $\tau$ at the optimal values of other parameters fixed due to previous stages of the optimization procedure. For better optimization, this procedure can be partially repeated.

By the same manner, any new type of article (e.g., new layer of photoresist) requires similar optimization of MLC-Stripper parameters to achieve maximum throughput for this layer of photoresist, at the set level of yield.

It is clear that without AEPE, e.g., without a controlled laser pulse length τ and adjustment of the orientation angles α and φ, in the necessary ranges, the L-Stripper cannot work in an optimal regime. Feasibility of an optical line for the L-Stripper with one HP Excimer laser is very limited because of the need to divide laser pulse frequency. As was noted earlier, the application of AEPE increases the efficiency of the optical line. This factor may provide more than two times the throughput rise (see Eq. (1)).

Depending on wafer type, one can speak about MLC cleaning, stripping or etching (e. g., wafer planarization) technology. These MLCF surface treatments can also be applied to other articles (besides semiconductor, wafers), e. g., to flat panels and so on.

The optical line which delivers the energy of the laser to the wafer and the other components of the apparatus for the treatment of the wafer need not be described in greater detail, as they are within the knowledge and ability of skilled persons and are additionally described in the cited PCT applicatior.

Figure 7:
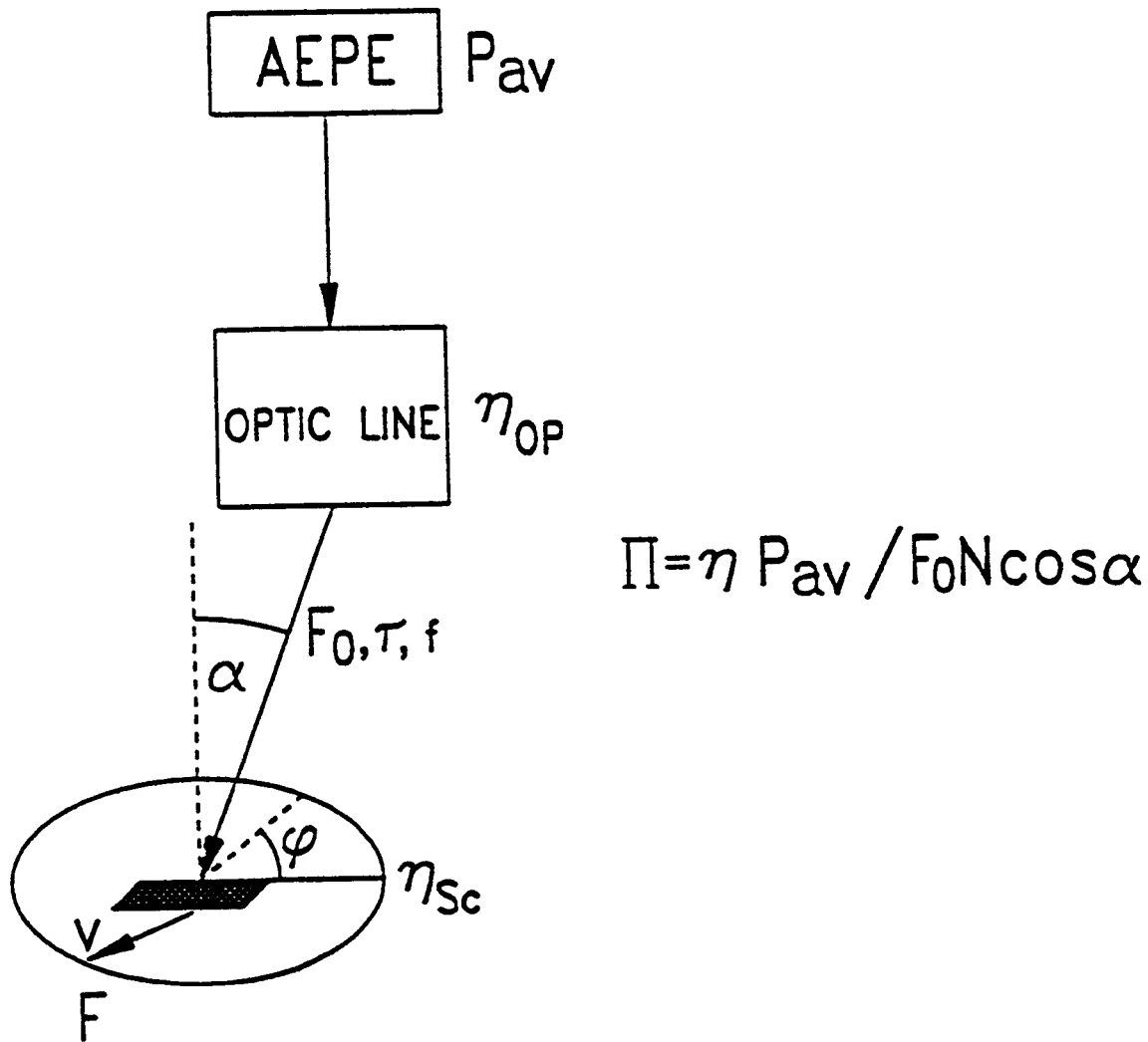
FIG. 7 is schematic illustration of an apparatus in which $\eta_{OP}=\eta_{PE}\cdot\eta_H\cdot\eta_{SH}\cdot\eta_{DIS}\cdot\eta_W\cdot\eta_G\cdot\eta_R$, where the optical line includes the whole way of the beam from laser till article $\eta_R=\eta_1\cdot\eta_2\cdot\eta_3\cdot\eta_4\cdot\eta_5$ and $\eta=\eta_{OP}\cdot\eta_{SC}$.

In FIG. 7, the beam incidence angle on the treated surface is indicated by α. It is preferably in the range from 0 to 60°. The beam azimuth is indicated by φ, and preferably changes from pulse to pulse, or from one stage of scanning to another.

The method and apparatus of the invention are useful in general for MLC surface foreign material removal., in particular semiconductor devices, such as MLC photoresist stripping of conductor wafers (VLSI/ULSI circuits), MLC surface cleaning from particulate, atomic and other contaminants, MLC surface etching. MLC dry etch planarization, and the like. The treated articles may be other than semiconductors, e.g. may also be Flat Panel Displays, compact disks, magnetic heads, wafers of bare silicon, While specific embodiments of the invention have been described for the purpose of illustration, it will be understood that the invention may be carried into practice by skilled persons with many modifications, variations and adaptations, without departing from its spirit or exceeding the scope of the claims.

What is claimed is:

1. Method of Multi-Laser Combustion (MLC) surface treatment by irradiation with laser beams, which comprises generating a plurality of laser beams having synchronized pulses and controlled delays, unifying said beams to a single beam and optically splitting every laser pulse into a number of sub-pulses.

2. Method according to claim 1, further comprising delivering the unified beams onto the surface to be treated.

3. Method according to claim 1, comprising synchronizing the pulses of the beams by synchronizing the triggering of the laser pumping means with electronically controlled delays.

4. Method according to claim 1, wherein the laser beams are optically split before they are unified.

5. Method according to claim 1, wherein the laser beams are optically telit after they are unified.

6. Method according to claim 1, wherein the optical splitting comprises constant optical delays between the sub-pulses.

7. Method according to claim 1, wherein the laser sub-pulses, into which the pulses are split, have the same duration as the pulses and amplitudes corresponding to the number of sub-pulses into which each laser pulse is split.

8. Method according to claim 1, wherein, if the generated laser beams are in the number of "n" and each pulse thereof is split into "m" sub-pulses the treated surface is irradiated by a unified laser beam consisting of n×m sub-pulses and having the same frequency as said pulses and an energy equal to the sum of the separate energies of said generated laser beams.

9. Method according to claim 1, further comprising homogenizing the generated beams.

10. Method according to claim 1, further comprising beam diversion for shaping, scanning and orientation with respect to the treated surface.

11. Method according to claim 10, wherein the scanning is implemented in a blanket manner.

12. Method according to claim 10, wherein the beam orientation is such that its incidence angle (α on the treated surface is in the range from 0 to 60°.

13. Method according to claim 10, wherein the beam orientation is such that its azimuth φ changes from pulse to pulse, or from one stage of scanning to another.

14. Apparatus for the generation of a laser beam for the optimized high throughput and yield, Multi-Laser Combustion (MLC) surface treatment, which comprises;

a plurality of laser heads, generating a plurality of pulsed laser beams;

means for the controlled synchronization of the said laser heads;

means for splitting each laser pulse into a plurality of sub-pulses with constant optical delays between them; and means for producing controlled electronic delays in said pluralities of said sub-pulses, which correspond to different laser pulses.

15. Apparatus according to claim 14, further comprising means for homogenizing the laser beams.

16. Apparatus for MLC surface treatments, comprising an apparatus according to claim 14 and further comprising means for the diversion of the laser beams;

means for continuous scanning of beam footprint;

a process chamber with an optical window for the said laser beam, for a treated article supplied by flow of ambient process gas, moving between the said optical window and the said treated article.

17. Apparatus, according to claim 14, wherein the plurality of laser heads constitutes a plurality of lasers, each with its own resonator.

18. Apparatus according to claim 14, wherein the plurality of laser heads constitutes a single multi-head laser with one resonator.

* * * * *

UNITED STATES PATENT AND TRADEMARK OFFICE
CERTIFICATE OF CORRECTION

PATENT NO. : 6,215,099 B1
DATED : April 10, 2001
INVENTOR(S) : Livshits

It is certified that error appears in the above-identified patent and that said Letters Patent is hereby corrected as shown below:

Column 1,
Line 6, "throughout" should read -- throughput --
Line 7, "as" should read -- such as --

Column 4,
Line 48, "is further" should read -- is a further --; and "a" (second occurrence) should be deleted Column 5,
Line 57, "in" should read -- on --

Column 8,
Line 17, "$f_1$50–100 Hz." should read -- $f_1$~50–100 Hz. --

Column 9,
Line 40, "ϕ" should read -- φ --; and the overstrike should read -- T), (2) --
Lines 45 and 51, "ϕ" should read -- φ --
Line 58, "Process" should read -- process --

Column 10,
Line 32, "ϕ" should read -- φ --
Line 49, "(α,ϕ(t)),'" should read -- (α,φ(t)), --

Column 11,
Line 6, "ϕ" should read -- φ --
Line 24, "applicatior." should read -- applications. --
Line 27, "ϕ" should read -- φ --
Line 31, "removal.," should read -- removal, --
Line 35, "etching." should read -- etching, --
Line 61, "telit" should read -- split --

UNITED STATES PATENT AND TRADEMARK OFFICE
CERTIFICATE OF CORRECTION

PATENT NO.    : 6,215,099 B1
DATED         : April 10, 2001
INVENTOR(S)   : Livshits It is certified that error appears in the above-identified patent and that said Letters Patent is hereby corrected as shown below:

<u>Column 12,</u>
Line 24, "(α" should read -- α --
Line 27, "ϕ" should read -- φ --
Line 31, "comprises;" should read -- comprises: --
Line 46, "comprising" should read -- comprising: --
Line 49, "footprint;" should read -- footprint; and --

Signed and Sealed this

Twenty-second Day of July, 2003

JAMES E. ROGAN
*Director of the United States Patent and Trademark Office*